United States Patent
Hedler et al.

(10) Patent No.: US 7,338,843 B2
(45) Date of Patent: Mar. 4, 2008

(54) METHOD FOR PRODUCING AN ELECTRONIC COMPONENT, ESPECIALLY A MEMORY CHIP

(75) Inventors: Harry Hedler, Germering (DE); Roland Irsigler, München (DE); Barbara Vasquez, Lafayette, CA (US)

(73) Assignee: Infineon Technologies AG, Minich (DE)

( * ) Notice: Subject to any disclaimer, the term of this patent is extended or adjusted under 35 U.S.C. 154(b) by 450 days.

(21) Appl. No.: 10/477,967

(22) PCT Filed: May 13, 2002

(86) PCT No.: PCT/EP02/05254

§ 371 (c)(1), (2), (4) Date: May 10, 2004

(87) PCT Pub. No.: WO03/001588

PCT Pub. Date: Jan. 3, 2003

(65) Prior Publication Data

US 2005/0048676 A1   Mar. 3, 2005

(30) Foreign Application Priority Data

May 15, 2001   (DE) ................. 101 23 686

(51) Int. Cl.
*H01L 21/326* (2006.01)
*H01L 21/479* (2006.01)
*H01L 21/44* (2006.01)

(52) U.S. Cl. .............. 438/132; 438/467; 438/601; 438/662; 438/940; 257/E21.596; 257/E21.592; 257/E23.15

(58) Field of Classification Search ............. None
See application file for complete search history.

(56) References Cited

U.S. PATENT DOCUMENTS

| | | | | |
|---|---|---|---|---|
| 5,572,409 A | * | 11/1996 | Nathan et al. | 361/806 |
| 5,641,701 A | * | 6/1997 | Fukuhara et al. | 438/6 |
| 5,808,351 A | * | 9/1998 | Nathan et al. | 257/528 |
| 5,813,881 A | * | 9/1998 | Nathan et al. | 439/516 |
| 6,025,256 A | * | 2/2000 | Swenson et al. | 438/601 |
| 6,048,741 A | | 4/2000 | Yu et al. | |
| 6,211,080 B1 | * | 4/2001 | Tatah | 438/680 |

(Continued)

FOREIGN PATENT DOCUMENTS

EP   0735576   10/1996

(Continued)

OTHER PUBLICATIONS

KIPO Office Action, Nov. 15, 2005 in Korean Application Ser. No. 9-5-2005-057770030.

*Primary Examiner*—David E Graybill
(74) *Attorney, Agent, or Firm*—Collard & Roe, P.C.

(57) ABSTRACT

A method for producing an electronic component, especially a memory chip, using a laser-induced correction to equalize an integrated circuit by means of at least one laser via in a layer at least partially covering the circuit. The component comprises a rewiring of the contact pads. The inventive method comprises the following steps: each laser via is closed by means of a separate covering layer which is to be applied locally; a rewiring extending between the local covering layers is created; the local covering layers are removed; and the laser-induced correction is carried out by means of the open laser vias.

25 Claims, 5 Drawing Sheets

Figure 1A:
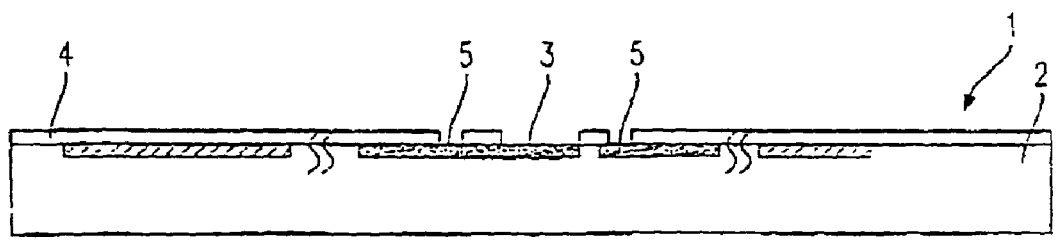

U.S. PATENT DOCUMENTS 6,214,630 B1    4/2001  Hsuen et al.
6,518,643 B2 *  2/2003  McDevitt et al. ........... 257/529
6,822,309 B2 * 11/2004  Hirota ........................ 257/529

FOREIGN PATENT DOCUMENTS

| EP | 0735583 | 10/1996 |
| EP | 1073118 | 1/2001 |
| KR | 03 84 964 | 8/2003 |

* cited by examiner

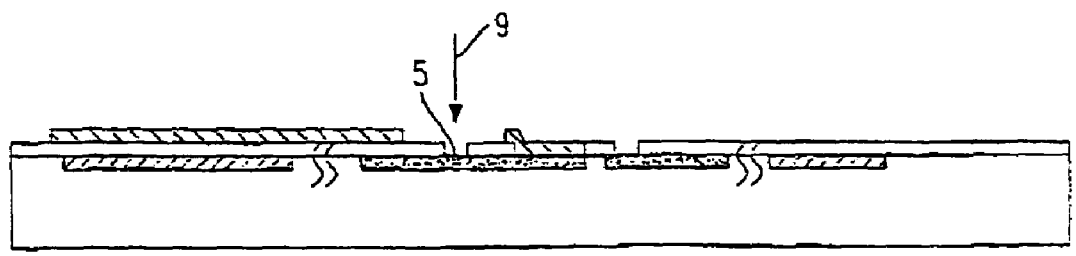
Fig. 5a
Fig. 5b
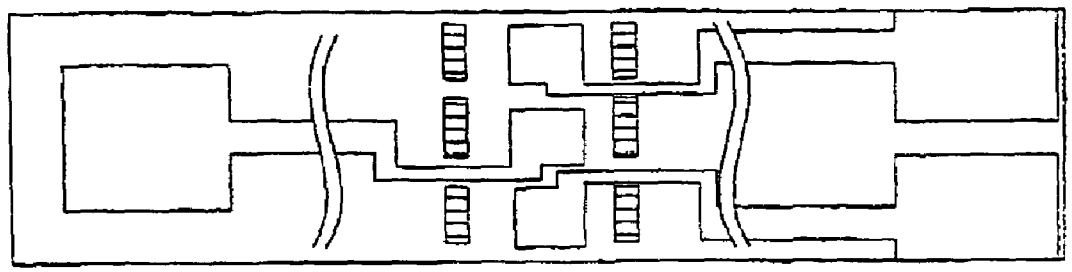
Fig. 6a
Fig. 6b

METHOD FOR PRODUCING AN ELECTRONIC COMPONENT, ESPECIALLY A MEMORY CHIP

CROSS REFERENCE TO RELATED APPLICATIONS

Applicants claim priority under 35 U.S.C. §119 of GERMANY Application No. 101 23 686.7 filed on May 15, 2001. Applicants also claim priority under 35 U.S.C. §365 of PCT/EP02/05254 filed on May 13, 2002. The international application under PCT article 21(2) was not published in English.

The present invention relates to a method for producing an electronic component, in particular a memory chip, with a laser-induced correction for the adjustment of an integrated circuit by means of one or more laser vias introduced into a layer that at least partially covers the circuit, the component having a rewiring of the contact pads.

US-B1-6,214,630 discloses a method for producing an electronic component with a laser-induced correction for the adjustment of an integrated circuit, in which the individual laser fuse lines are closed off or coated by means of a thin passivation layer. A covering layer is applied to the entire wafer and first laser vias are opened. Afterward, a first laser-induced correction is carried out at the first laser fuse lines through the opened first laser vias, which are subsequently closed with a separate cover layer applied globally. Afterward, a further covering layer is applied to the entire wafer, and a rewiring is produced which runs between a second set of laser vias. The second laser vias are thereupon opened, and a second laser-induced correction is carried out through the opened second laser vias.

In a large number of electronic components, in particular in the form of memory chips, an adjustment of the integrated circuit is necessary in order to set a desired value. A laser-induced correction is preferably utilized for the purpose of adjustment. In this case, laser light is used to interrupt laser fuse lines which are arranged below a covering layer, generally a polyimide layer, and are accessible by way of previously opened laser vias. This adjustment is effected directly after the completion of the wafer in the front end. After the laser adjustment, the via openings have to be closed again by a second polyimide layer, applied in large-area fashion, in order to avoid short circuits during the subsequent processes of (metallization for the rewiring) and in order to prevent a corrosion of the laser fuses. A rewiring is necessary since the spacing of the contact pads which are located near the laser vias on the front-end chip is too small to be able to use standard module boards. Said rewiring, which is produced by electroplating, usually runs over the laser vias that have been covered again. The production of the rewiring is followed by the housing and burn-in processes. However, since the adjustment has already been effected, these later processes, which may possibly have adverse effects on the operation or the functionality of the circuit or of the component, can no longer be taken into account in the adjustment since a laser intervention is no longer possible after the housing process. Consequently, it is not possible to correctly adjust, and if appropriate, repair components which exhibit additional faults precisely in these final work steps. This results in increased rejects.

A further disadvantage besides the deficient adjustment possibility and hence inflexibility of the previous method as mentioned in the introduction is to be seen in the fact that the method described in the introduction is also very complicated in terms of process engineering. In the known method, firstly, a first covering layer is applied to the chip or wafer, in which the laser vias are subsequently introduced into the photosensitive covering layer by means of phototechnology. A second polyimide covering layer is applied after adjustment has been effected. Finally, it must also be ensured that the contact pads are opened again in order that the rewiring can subsequently be applied. This step is usually realized by means of phototechnology, which is complicated and expensive.

Overall, the known conventional method is very complicated and laborious.

The invention is thus based on the problem of specifying a simple and flexible method which enables the laser adjustment also to be carried out at a later point in time.

In order to solve this problem, in the case of a method of the type mentioned in the introduction, the invention provides the following steps:

closing off of each laser via by means of a separate cover layer that is to be applied locally, production of a rewiring running between the local cover layers, removal of the local cover layers, carrying out of the laser-induced correction by means of the opened laser vias, and if necessary, closing off of the laser vias by means of a covering layer.

The method according to the invention advantageously provides for the individual laser vias to be closed off by means of separate cover layers that are to be applied locally and for the previous practice in the prior art of applying a large-area polyimide covering to be obviated. In contrast to the prior art, the rewirings are subsequently applied in such a way that they no longer run over the covered laser vias, but rather between the laser vias or the local cover layers, which affords the advantage that the local cover layers can be removed again at an arbitrary later point in time in order to perform the laser-induced correction. The necessary constriction of the rewiring interconnect that possibly accompanies this positioning of the rewiring is not problematic since the distance of the possible constriction is only very short, and, therefore, only a very small increase in the interconnect resistance is produced. After carrying out the laser-induced correction—which, as described, can be effected at an arbitrary point in time precisely after the production of the rewiring—the laser vias are finally closed off as required by means of a covering layer.

Overall, the method according to the invention permits a laser adjustment at an arbitrary point in time. In other words, it is possible, in a particularly advantageous manner, after the production of the rewiring and thus before the removal of the covering layer that locally covers the laser vias, to test the component or the memory chip/wafer and to carry out a burn-in, and only afterward to perform the adjustment. In the context of this adjustment, it is then advantageously possible, by way of example, also to repair and adjust those chips which only exhibit additional faults in the final work steps.

In a development of the concept of the invention, it may be provided that a cover layer that can be decomposed chemically, thermally or by irradiation, in particular by UV irradiation, is used as the cover layer. Such a cover layer can be removed very easily, if it becomes necessary for the purpose of opening the laser vias; in a particularly advantageous manner, a complicated etching step or possible photolithographic steps are not necessary.

An invention alternative to the method for producing an electronic component described in the introduction provides the following steps according to the invention:

closing off of each laser via by means of a separate thin cover layer that is to be applied locally, production of a rewiring running between the local cover layers, and carrying out of the laser-induced correction by means of the closed laser vias.

According to this expedient configuration of the invention, the laser vias are likewise covered by means of a local, but thin, cover layer, each laser via being closed off with a separate cover layer in this case as well. The rewiring running between the local cover layers is subsequently applied. Unlike in the method described in the introduction, however, here the cover layer is no longer removed, rather a laser-induced correction is effected through the closed laser vias. Since the cover layer is very thin and advantageously has a thickness of $\leq 1$ μm, it is possible to penetrate through the cover layer with the laser.

This method according to the invention also affords extensive freedom with regard to performing the laser adjustment within the manufacturing process, since the laser vias—even though they are always closed off in the case of this method according to the invention—are accessible at any arbitrary point in time on account of the positioning of the rewiring. Thus, it is possible in this case as well to test the chip or wafer and to carry out a burn-in and only afterward to perform the correction.

The cover layer should in any event be resistant to a subsequent etching step that is effected in particular for the purpose of producing the rewiring. Such an etching step is normally necessary for etching away the plating base which was sputtered on over the whole area after the closing off of the laser vias and was treated in a subsequent photolithography step for patterning the rewiring. The cover layer is not permitted to decompose in this case.

Furthermore, it may be provided that—if it is permitted by the process sequence—a reinforcing cover layer is applied to the thin cover layer after the adjustment for protection purposes, which may be necessary from case to case.

According to a particularly expedient configuration of the invention, it is provided that the first and/or the reinforcing cover layer and/or the covering layer are printed on. The requirements which the method according to the invention imposes on the positioning accuracy of the cover layers that close off the laser vias or else of the covering layer and the structure resolution are less stringent in the case of the method according to the invention than in the case of the known process sequence in the prior art, which is why it is possible to have recourse to a simple printing technique for applying the cover layer or the covering layer. For this purpose, use is expediently made of a mask or screen printing method in which the cover layer or covering layer, preferably composed of a polymer material, can be applied. In a particularly advantageous manner, the high-precision phototechnology as required in the prior art is thus obviated; equally, the expensive photosensitive polyimides which have to be processed lithographically in a complicated manner in the case of the known method according to the prior art are no longer necessary, rather it is possible to use inexpensive printable polymers for the respective layer production.

A further invention alternative to the method for producing an electronic component described in the introduction provides the following steps according to the invention:

coating of the individual laser fuse lines by means of a thin passivation layer comprising silicon nitride, silicon oxynitride, silicon oxide or other suitable materials, application of a covering layer, generally a polyimide layer, to the entire wafer, opening of the laser vias and of the contact pads, production of a rewiring running between the laser vias, and carrying out of the laser-induced correction at the passivated laser fuse lines through the opened laser vias.

According to this expedient configuration of the invention, the laser fuse lines (possibly as early as in the front end) are covered with a thin passivation layer and then the entire wafer is coated with a covering layer, e.g. polyimide. The windows for the laser vias and contact pads are thereupon opened. The rewiring running between the laser vias is subsequently applied. In the case of the method of this configuration of the invention, the thin passivation layer over the laser fuse lines is no longer removed, rather the laser-induced correction is effected at the covered laser fuse lines in the opened laser vias. Since the passivation layer of the laser fuse lines is very thin and advantageously has a thickness of $\leq 0.5$ μm, it is possible to penetrate through this thin passivation layer with the laser.

This method according to the invention also affords extensive freedom with regard to performing the laser adjustment within the manufacturing process, since the laser fuses—even though they are always closed off in the case of this method according to the invention—are accessible at any arbitrary point in time by way of the opened laser vias and on account of the positioning of the rewiring. Thus, it is possible in this case as well to test the chip or wafer and to carry out a burn-in, and only afterward to perform the correction.

The passivation layer of the laser fuse lines should likewise in any event be resistant to a subsequent etching step that is effected in particular for the purpose of producing the rewiring. A layer thickness of less than 0.5 μm is generally sufficient when using silicon nitride, silicon oxynitride or silicon oxide. The layer thickness may be matched correspondingly when using other materials.

It may furthermore be provided that—if it is permitted by the process sequence—the laser vias are covered again after the adjustment, which may be necessary from case to case. Owing to the modest requirements imposed on the positioning accuracy, said cover layer may also be printed on. For this purpose, use is expediently made of a mask or screen printing method in which the cover layer or covering layer, preferably comprising a polymer material, can be printed on. In a particularly advantageous manner, the high-precision phototechnology as required in the prior art is thus obviated; equally, the expensive photosensitive polyimides which have to be processed lithographically in a complicated manner in the case of the known method according to the prior art are no longer necessary, rather it is possible to use inexpensive printable polymers for the respective layer production.

A further invention alternative to the method for producing an electronic component just described consists in opening the contact pads separately for the rewiring and opening the laser vias only after the rewiring that is to be carried out in the manner described. This has the advantage that the covered laser fuse lines cannot be attacked by the etching step for producing the rewiring. In this case, it is possible to reduce the layer thickness of the laser fuse passivation layer or to completely dispense therewith.

Figure 1B:
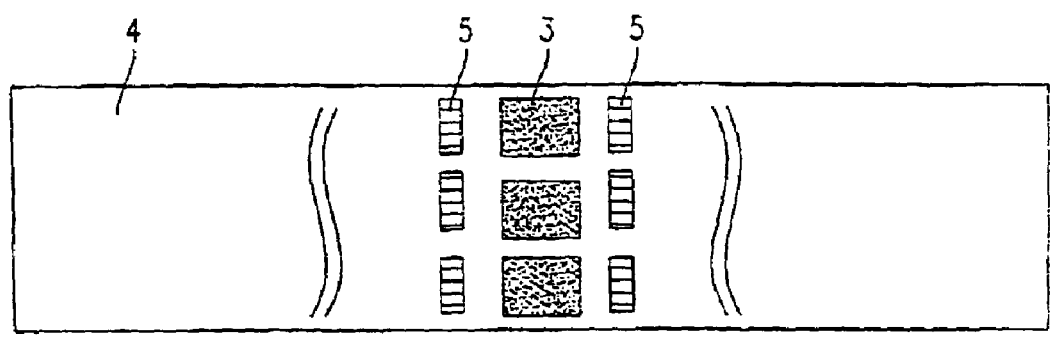
Figure 2A:
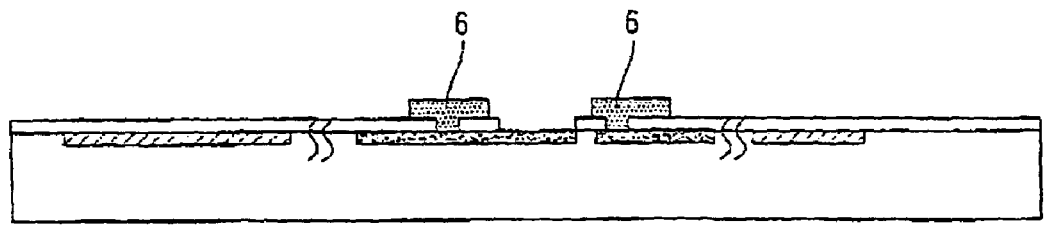
Figure 2B:
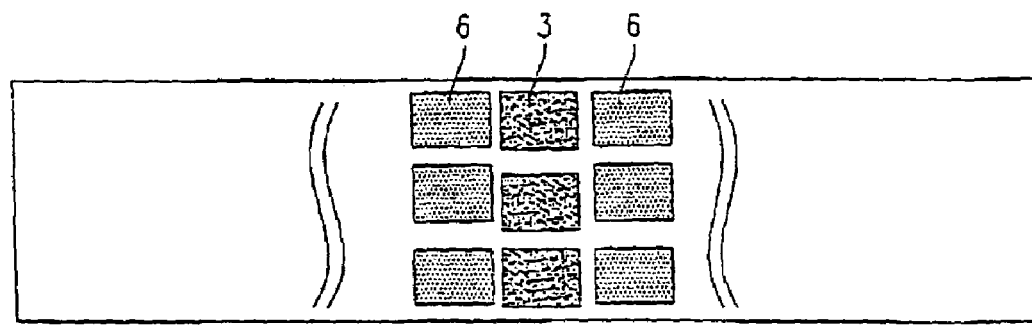
Figure 3A:
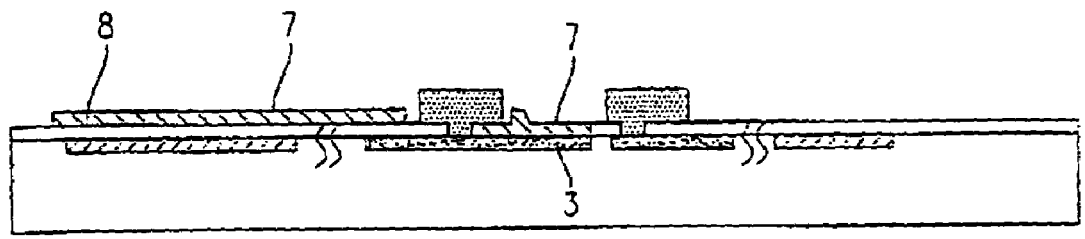
Figure 3B:
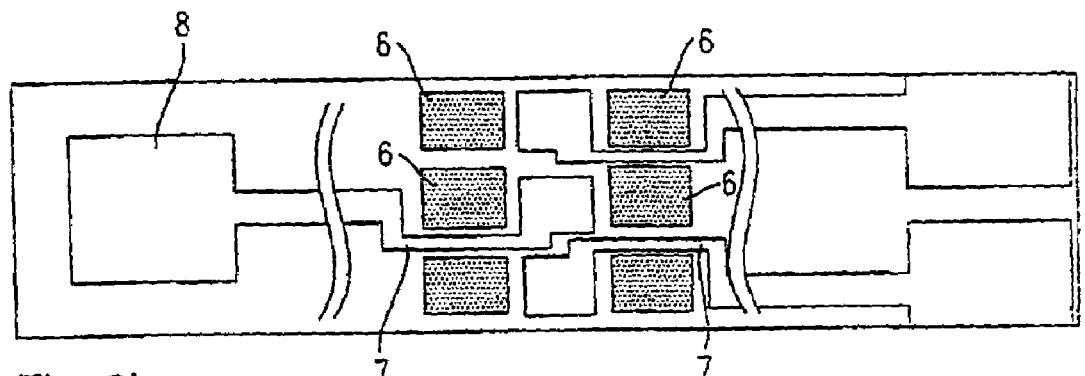
Figure 4A:
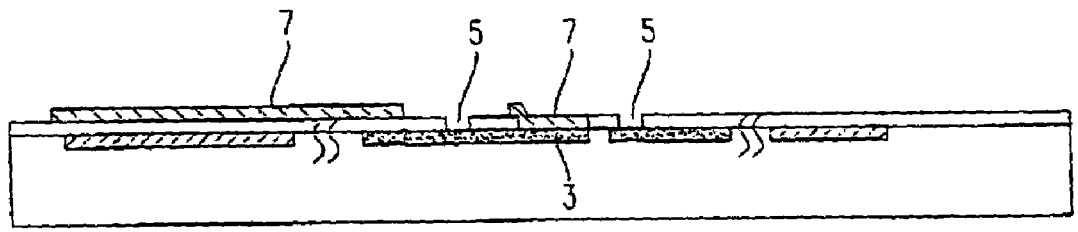
Figure 4B:
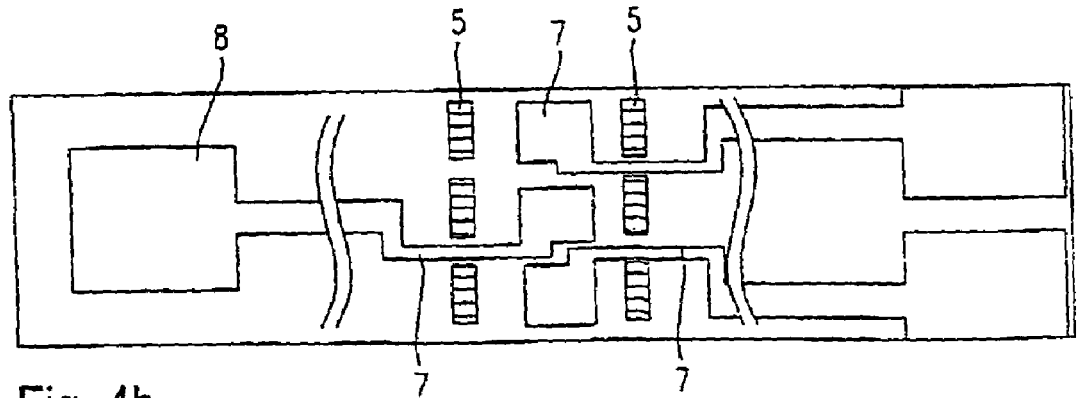
Figure 7A:
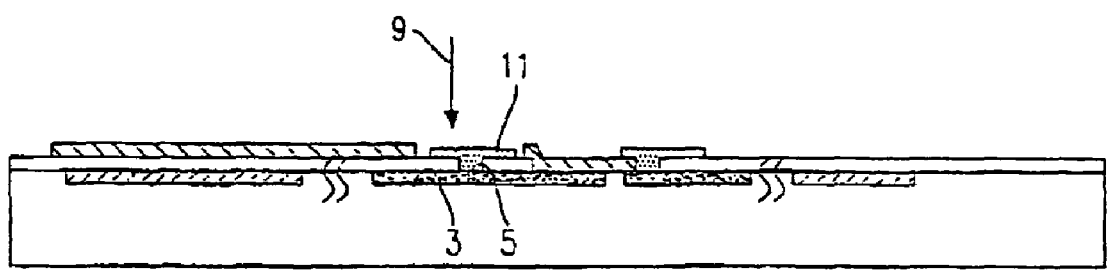
Figure 7B:
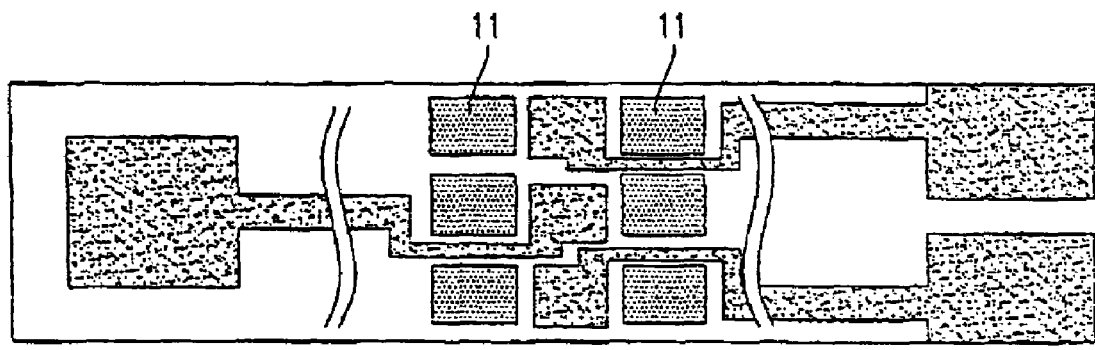
Figure 8A:
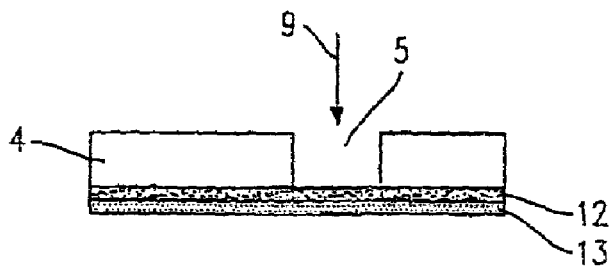
Figure 8B:
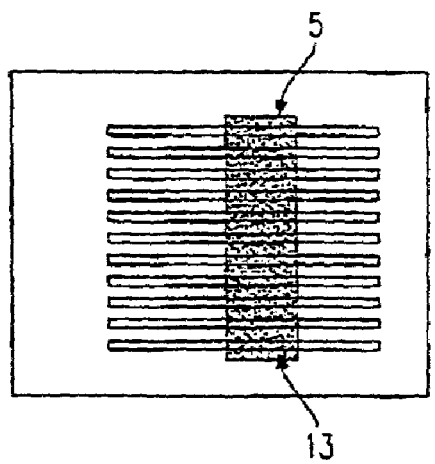
Figure 8C:
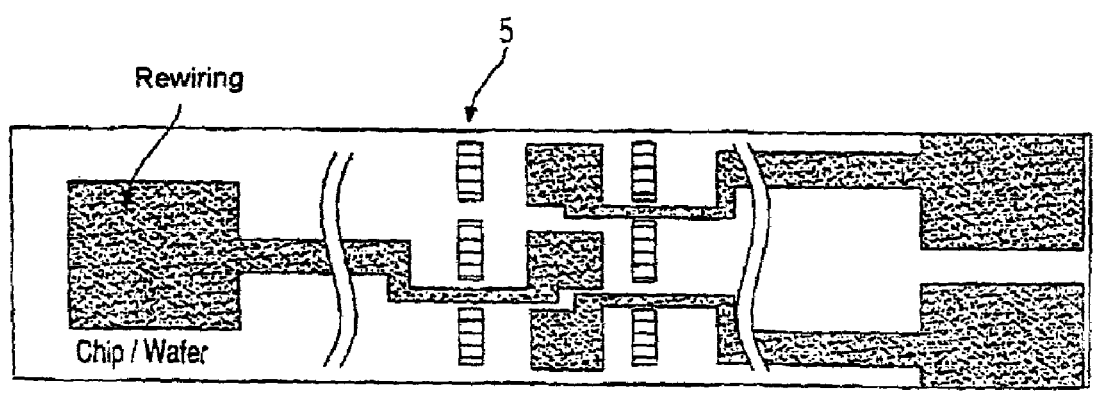

Further advantages, features and details of the invention emerge from the exemplary embodiment described below and from the drawings, in which:

FIGS. 1a, 1b show a chip or wafer in its initial configuration in a sectional view and a plan view, FIGS. 2a, 2b show the chip/wafer from FIG. 1a, b after the application of the cover layers that close off the laser vias in a sectional view and a plan view, FIGS. 3a, 3b show the chip/wafer from FIGS. 2a, b after the processing of the rewiring in a sectional view and a plan view, FIGS. 4a, 4b show the chip/wafer from FIGS. 3a, b after the decomposition of the cover layers that cover the laser vias in a sectional view and a plan view, FIGS. 5a, b show the chip/wafer from FIGS. 4a, b during the laser adjustment in a sectional view and a plan view, FIGS. 6a, 6b show the chip/wafer from FIGS. 5a, b after the application of the covering layer that covers the laser vias in a sectional view and a plan view, FIGS. 7a, 7b show a chip/wafer corresponding to that in accordance with FIGS. 1a, b after the application of a thin cover layer that covers the laser vias and a laser adjustment effected through the cover layer, in a sectional view and a plan view, and FIGS. 8a-c show, in a side view and a plan view, the details of a method alternative in which, instead of the cover layer, a thin passivation layer is applied to the laser fuse lines.

FIGS. 1a, 1b show an electronic component 1 according to the invention in the form of a chip or wafer 2 in a sectional view and a plan view. In addition to an integrated circuit not shown in more specific detail, contact pads 3 were applied on the substrate of the chip or wafer 2, at which contact pads, as will be described below, a rewiring is to be provided. The top side of the chip or wafer 2 is covered with a polyimide layer 4 in a large-area manner. Laser vias 5 assigned to the contact pads 3 are introduced into the polyimide layer 4, it being possible for underlying lines to be interrupted by way of said laser vias by means of laser light for the adjustment of the integrated circuit. All the figures show the component 1 in the form of a basic illustration; the actual construction of such a component may be as desired and is sufficiently known.

In the next step (FIGS. 2a, 2b), the laser vias 5 are closed off by means of a cover layer 6. The cover layer 6 is e.g. a simple polymer material which can be printed on in a mask or screen printing method. As shown by FIG. 2b, in particular, each laser via is covered with a dedicated cover layer 6; the cover layers 6 of adjacent laser vias are spaced apart from one another.

A rewiring 7 is then laid into this interspace between the cover layers 6, see FIGS. 3a, 3b, which rewiring on the one hand makes contact with the contact pad 3 (see FIG. 3a) and on the other hand forms a contact pad 8 for the connection to the module board or a further chip. As can be seen from FIG. 3b, the width of the wiring interconnect narrows somewhat in the region between the cover layers 6, but the increase in resistance that results from this is minimal and tolerable.

After the processing of the rewiring in accordance with FIGS. 3a, 3b, it is then possible, by way of example, to test the chip or wafer and carry out a burn-in, this not being specifically illustrated in the figures.

In accordance with FIGS. 4a, 4b, a step for decomposition of the cover layers 6 covering the individual laser vias is then effected in order to enable a later adjustment. The polymer used as cover layer 6 can expediently be decomposed chemically, thermally or by electromagnetic irradiation, in particular UV irradiation, i.e. the cover layer can be removed in a simple manner by solvents, corresponding heating or irradiation of the chip or wafer and the respective laser via 5 can be opened in this simple manner, as is clearly shown by FIGS. 4a, 4b.

Afterward, see FIGS. 5a, 5b, the laser adjustment is effected by a laser beam 9 interrupting underlying lines if necessary, by way of the laser vias 5. Such an adjustment is sufficiently known per se. The adjustment or the correction can be effected, as explained, at any desired point in time after the production of the rewiring since, according to the invention, the rewiring no longer lies above the laser vias but rather in the region in between.

After the laser-induced correction has been carried out in accordance with FIGS. 5a, 5b, the final covering of the laser vias 5 is effected in a last step. For this purpose, a final covering layer 10 is printed on in a large-area manner in this case. The laser vias are clearly closed off completely in this way. This cover layer, too, is expediently printed on in a mask or screen printing method using a suitable inexpensive polymer.

The method according to the invention is thus distinguished by the following process steps, only the essential process steps relevant to the method being mentioned here:

Printing of the separate cover layers by way of the open laser vias in polyimide covering→sputtering of the plating base (whole-area)→photolithography for patterning the rewiring→electroplating of the rewiring→etching-away of the plating base→resolution or decomposition of the cover layers→laser adjustment by way of open laser vias in the polyimide covering→printing of the covering layer by way of an open laser via in the polyimide covering.

FIGS. 7a, 7b show the method alternative described in the introduction in which, instead of the cover layer 6 which is decomposed and removed for the purpose of laser adjustment and consequently functions as a sacrificial layer, a significantly thinner cover layer 11 is printed on over each laser via 5. The thickness of this cover layer 11 should be $\leq 1$ μm. In any event, the thickness is to be chosen such that the cover layer can be penetrated by the laser light used. The laser adjustment or the laser-induced correction 9 can be effected directly through this very thin cover layer 11. It is no longer necessary for this purpose to remove the cover layer 11 for the adjustment and to subsequently close off the laser via again. As is shown in FIGS. 7a, 7b, the rewirings run between the local cover layers 11 in this case as well. In this configuration of the invention, too, a test and a burn-in are possible at any desired point in time after the production of the rewiring, and the laser adjustment can be effected at the end of the manufacturing process in this case as well.

This manufacturing process may be characterized by the following steps:

Printing of the thin cover layer with a thickness of preferably $\leq 1$ μm by way of open laser vias in the polyimide covering→sputtering of the plating base (whole-area)→photolithography for patterning the rewiring→electroplating of the rewiring→etching-away of the plating base→laser adjustment by way of closed laser vias in the polyimide covering.

In this configuration of the method, too, a printable, simple and inexpensive polymer is used as cover layer. Generally, care must be taken to ensure that the applied cover layer is sufficiently etching-resistant toward the etching process that is effected in the context of producing the rewiring.

FIGS. 8a and 8b show, in a side view and a plan view, the details of the method alternative described in the introduction in which, instead of the cover layer 6 which is decomposed and removed for the laser adjustment and consequently functions as a sacrificial layer, a thin passivation layer 12 is applied to the laser fuse lines 13. The thickness of this passivation layer 12 should be ≦0.5 μm. In any event, the thickness is to be chosen such that the passivation layer can be penetrated by the laser light used. The laser adjustment or the laser-induced correction 9 can be effected directly through this very thin passivation layer 12. It is no longer necessary for this purpose to remove the passivation layer 12 for the adjustment and to subsequently close off the laser via again. As is shown by FIG. 8c, the rewirings run between the laser vias 5 in this case as well. In this configuration of the invention, too, a test and a burn-in are possible at any desired point in time after the production of the rewiring, and the laser adjustment can be effected at the end of the manufacturing process in this case as well.

This manufacturing process may be characterized by the following steps:

Closing off or coating of the individual laser fuse lines by means of a thin passivation layer having a thickness of preferably ≦0.5 μm→application of a covering layer→photolithography for opening the laser vias and contact pads→sputtering of the plating base (whole-area)→photolithography for patterning the rewiring→electroplating of the rewiring→etching-away of the plating base→laser adjustment at the passivated laser fuse lines in the laser via openings.

In this configuration of the method, silicon nitride, silicon oxynitride, silicon oxide or another suitable material is used as the passivation layer. Generally, care must be taken to ensure that the applied passivation is sufficiently etching-resistant toward the etching process that is effected in the context of producing the rewiring.

The invention claimed is:

1. A method for producing an electronic component, in particular a memory chip, with a laser-indexed correction for the adjustment of an integrated circuit by means of one or more laser vias introduced into a covering layer that at least partially covers the circuit, the component having a rewiring of the contact pads, comprising the following steps:
   closing off of each laser via by means of a separate thin cover layer that is to be applied locally,
   production of a rewiring running between the local cover layers, and
   carrying out of the laser-induced correction by means of the closed laser vias.

2. The method as claimed in claim 1, characterized in that a reinforcing cover layer is applied to the thin cover layer after the correction.

3. The method as claimed in claim 1, characterized in that the if appropriate first cover layer has a thickness of ≦1 μm.

4. The method as claimed in claim 1, characterized in that the if appropriate first cover layer is resistant to a subsequent etching step that is effected in particular for the purpose of producing the rewiring.

5. A method for producing an electronic component with a laser-indexed correction for adjustment of an integrated circuit by means of a plurality of laser vias introduced into a layer that at least partially covers the circuit, comprising the following steps:
   (a) providing a plurality of separate local cover layers that are to be applied locally, each local cover layer closing a respective laser via;
   (b) producing a rewiring of contact pads applied to the component running between the local cover layers;
   (c) removing the local cover layers to open the laser vias; and
   (d) carrying out the laser-indexed correction following opening of the laser vias by means of the laser vias.

6. The method as claimed in claim 5, wherein the laser vias are covered again by means of a covering layer after laser adjustment has been effected.

7. The method as claimed in claim 5, wherein a cover layer that can be decomposed chemically, thermally or by irradiation is used as the cover layer.

8. The method as claimed in claim 5, wherein printing takes place on the local cover layers.

9. The method as claimed in claim 8, wherein printing takes place in a mask or screen printing method.

10. The method as claimed in claim 5, wherein each cover layer comprises a polymer layer.

11. The method as claimed in claim 5, wherein the component is tested before the local cover layers are removed.

12. A method for producing an electronic component with a laser-indexed correction for adjustment of an integrated circuit by means of a plurality of laser vias introduced into a covering layer that at least partially covers the circuit, comprising the following steps:
   (a) providing a thin passivation layer to close or coat individual laser fuse lines of the component;
   (b) applying a covering layer to the entire component to cover the laser vias and contact pads applied to the component;
   (c) opening the laser vias and the contact pads;
   (d) producing a rewiring of the contact pads running between the laser vias; and
   (e) carrying out the laser-indexed correction at the laser fuse lines through the laser vias.

13. The method as claimed in claim 12, wherein the laser vias are covered again by means of a covering layer after laser adjustment has been effected.

14. The method as claimed in claim 12, wherein the passivation layer on the laser fuse lines has a thickness of ≦0.5 μm.

15. The method as claimed in claim 12, wherein the passivation layer on the individual laser fuse lines is resistant to a subsequent etching step that is effected to produce the rewiring.

16. The method as claimed in claim 12, wherein printing takes place on a reinforcing cover layer.

17. The method as claimed in claim 12, wherein the covering layer comprises a polymer layer.

18. The method as claimed in claim 12, wherein the component is tested before carrying out the laser-induced correction through the laser fuse lines.

19. A method for producing an electronic component with a laser-indexed correction for adjustment of an integrated circuit by means of a plurality of laser vias introduced into a covering layer that at least partially covers the circuit, comprising the following steps:
   (a) providing a thin passivation layer to coat individual laser fuse lines of the component;
   (b) applying a covering layer to the entire component to cover the laser vias and contact pads applied to the component;
   (c) opening the contact pads;
   (d) producing a rewiring of the contact pads running between the laser vias;

(e) opening the laser vias; and
(f) carrying out the laser-indexed correction at the laser fuse lines through the laser vias.

20. The method as claimed in claim 19, wherein the laser vias are covered again by means of a covering layer after laser adjustment has been effected.

21. The method as claimed in claim 19, wherein the passivation layer on the individual laser fuse lines has a thickness of between zero and 0.5 μm.

22. The method as claimed in claim 19, wherein the component is tested before the carrying out of the laser-induced correction and coating of the individual laser fuse lines and/or a burn-in is carried out.

23. The method as claimed in claim 19, wherein printing takes place on the covering layer.

24. The method as claimed in claim 19, wherein the covering layer comprises a polymer layer.

25. The method as claimed in claim 19, wherein the component is tested before a burn-in is carried out.

* * * * *